(12) United States Patent
Ichinose et al.

(10) Patent No.: US 8,835,947 B2
(45) Date of Patent: Sep. 16, 2014

(54) DISPLAY APPARATUS

(75) Inventors: Yuushi Ichinose, Yokohama (JP); Noa Sumida, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/532,029

(22) Filed: Jun. 25, 2012

(65) Prior Publication Data

US 2013/0001609 A1      Jan. 3, 2013

(30) Foreign Application Priority Data

Jun. 30, 2011   (JP) ................................. 2011-146514

(51) Int. Cl.
*H01L 51/52* (2006.01)
*H01L 27/32* (2006.01)

(52) U.S. Cl.
CPC ........ *H01L 51/5275* (2013.01); *H01L 51/5265* (2013.01); *H01L 27/3211* (2013.01)
USPC .......................................................... 257/89

(58) Field of Classification Search
CPC ............ H01L 51/5275; H01L 51/5265; H01L 27/3211
See application file for complete search history.

(56) References Cited

U.S. PATENT DOCUMENTS

| | | | | |
|---|---|---|---|---|
| 7,374,328 | B2 * | 5/2008 | Kuroda et al. | 362/620 |
| 7,717,589 | B2 * | 5/2010 | Nishioka et al. | 362/293 |
| 2006/0175966 | A1 * | 8/2006 | Yamada et al. | 313/506 |
| 2010/0314636 | A1 * | 12/2010 | Matsunami et al. | 257/88 |
| 2010/0327304 | A1 * | 12/2010 | Sonoda et al. | 257/98 |
| 2011/0057210 | A1 * | 3/2011 | Sonoda et al. | 257/88 |
| 2011/0057221 | A1 * | 3/2011 | Sonoda | 257/98 |
| 2011/0079797 | A1 * | 4/2011 | Sumida et al. | 257/88 |

FOREIGN PATENT DOCUMENTS

JP      2004-317559 A      11/2004
WO      01/39554 A1        5/2001

* cited by examiner

*Primary Examiner* — Andy Huynh
*Assistant Examiner* — Sitaramarao S Yechuri
(74) *Attorney, Agent, or Firm* — Canon U.S.A., Inc. IP Division

(57) ABSTRACT

In a display apparatus including an organic EL element utilizing the optical interference effect, and a lens, a diameter of the lens is set such that, of light radiated from the organic EL element into a protective layer, light radiated at a larger angle than an angle, at which a light intensity distribution of the light radiated into the protective layer with respect to a radiation angle of the light takes a local minimum value, is not output to the outside of the display apparatus.

12 Claims, 6 Drawing Sheets

DISPLAY APPARATUS

BACKGROUND OF THE INVENTION

1. Field of the Invention

The present invention relates to a display apparatus including an organic electroluminescence (EL) element.

2. Description of the Related Art

Recently, a display apparatus including organic EL elements, each having an organic compound layer between a pair of electrodes, has been developed with more eagerness. Regarding that type of organic EL element, as discussed in International Publication WO2001/039554, it is known that color purity and luminous efficiency of a luminescent color are improved by utilizing the optical interference effect. In more detail, an optical distance (optical path length) H between two electrodes is expressed by the following formula 1 by using an angle $\Theta$ of light emitted from the organic EL element ($\Theta$ is 0 degree when the light is visually recognized in a direction rightly facing the element), the sum $\phi$ of phase shifts caused when the emitted light is reflected at the two electrodes, and an integer m that is 0 or more. The light of a wavelength $\lambda$ (resonant wavelength) satisfying the formula 1 is intensified.

$$2H \cos \Theta = (m+(\phi/2\pi)) \times \lambda \qquad 1$$

Meanwhile, it is also known to dispose a lens on a display apparatus in order to more efficiently take out the light emitted from the organic EL element to the outside. Japanese Patent Laid-Open No. 2004-317559 discloses an organic EL device in which a lens array including lenses and banks serving as light absorbing layers is disposed on an organic EL element. Thus, that related art proposes a technique for increasing contrast by using the lens array.

SUMMARY OF THE INVENTION

However, the display apparatus including the organic EL elements, in each of which a film thickness etc. are set to be adapted for utilizing the optical interference effect, and the lenses has a problem as follows.

With the related art having the above-described arrangement, even the light emitted at a larger radiation angle and not taken out to the outside of the display apparatus in the absence of the lens is additionally taken out to the outside with the presence of the lens. On the other hand, in the organic EL element utilizing the optical interference effect, because the optical path length (i.e., the left side of the formula 1) is changed depending on the radiation angle, luminance is also changed depending on the radiation angle. More specifically, the luminance may be increased at the larger radiation angle in some cases. Therefore, when the light emitted at the larger radiation angle is taken out through the lens, the luminance is increased at the larger radiation angle and a luminance characteristic becomes unnatural.

In view of the problem described above, the present invention provides a display apparatus including an organic EL element utilizing the optical interference effect, and a lens, in which a good luminance characteristic is obtained.

According to an embodiment of the present invention, there is provided a display apparatus including an organic EL element including a first electrode, a luminescent layer, and a second electrode, the organic EL element radiating light through the second electrode, a protective layer disposed on the second electrode, and a lens disposed on the protective layer, wherein an optical distance L between a reflective surface provided by the first electrode and the luminescent layer satisfies a relationship of;

$$(\lambda_0/8) \times (4m+2\phi/\pi-1) < L < (\lambda_0/8) \times (4m+2\phi/\pi+1)$$

with respect to a maximum peak wavelength $\lambda_0$ in a spectrum of the light radiated from the organic EL element, a phase shift $\phi$ caused when the light is reflected at the reflective surface, and a positive integer m, a light intensity distribution with respect to a radiation angle of the light radiated from the organic EL element into the protective layer has a local minimum value, and a diameter of the lens is set such that, of light radiated into the protective layer, light radiated at a larger angle than an angle, at which the light intensity distribution takes the local minimum value, is not output to an outside of the display apparatus.

With the embodiment of the present invention, a good luminance characteristic is obtained in the display apparatus including the organic EL element utilizing the optical interference effect, and the lens.

Further features of the present invention will become apparent from the following description of exemplary embodiments with reference to the attached drawings.

DESCRIPTION OF THE EMBODIMENTS

Figure 1A:
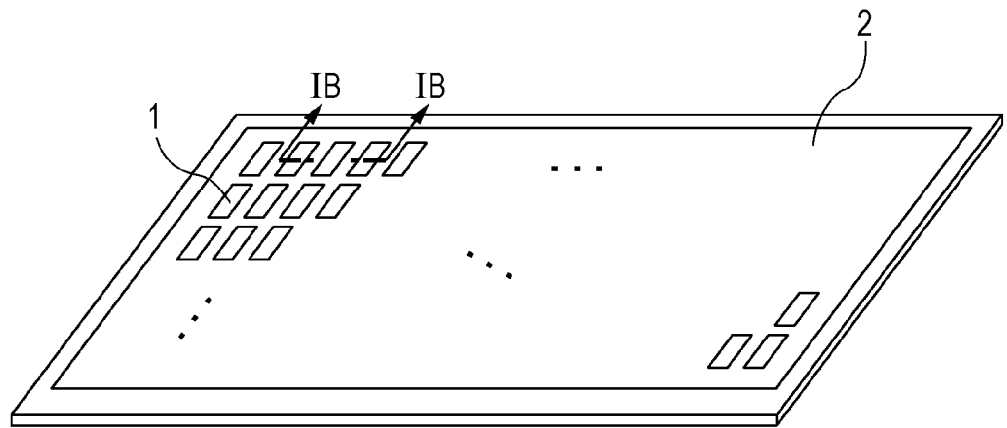
FIGS. 1A and 1B are a schematic perspective view and a schematic sectional view, respectively, of a display apparatus according to an embodiment of the present invention.

An embodiment of the present invention will be described below with reference to the drawings, but the present invention is not limited to the following embodiment. It is to be noted that parts not specifically illustrated in the drawings or described in the specification can be practiced by employing the general or known techniques in the relevant technical field.

FIG. 1A is a schematic perspective view of a display apparatus according to an embodiment of the present invention. The display apparatus according to the embodiment of the present invention includes a plurality of pixels 1 each including an organic EL element. The plural pixels 1 are arrayed in a matrix pattern, and they form a display region 2. The term "pixel" used herein implies a region corresponding to a luminescent region of one light-emitting element. In the display apparatus according to the embodiment, the light-emitting element is an organic EL element, and the organic EL element of one color is disposed in one-to-one relation to the pixel 1. A luminescent color of the organic EL element is, e.g., red, green or blue. The luminescent color may be yellow or cyan. Further, the display apparatus according to the embodiment includes an array of plural pixel units each including a plurality of pixels having different luminescent colors (e.g., a red light-emitting pixel, a green light-emitting pixel, and a blue light-emitting pixel). The term "pixel unit" implies a minimum unit capable of emitting light of the desired color through color mixing with lights emitted from the pixels.

Figure 1B:
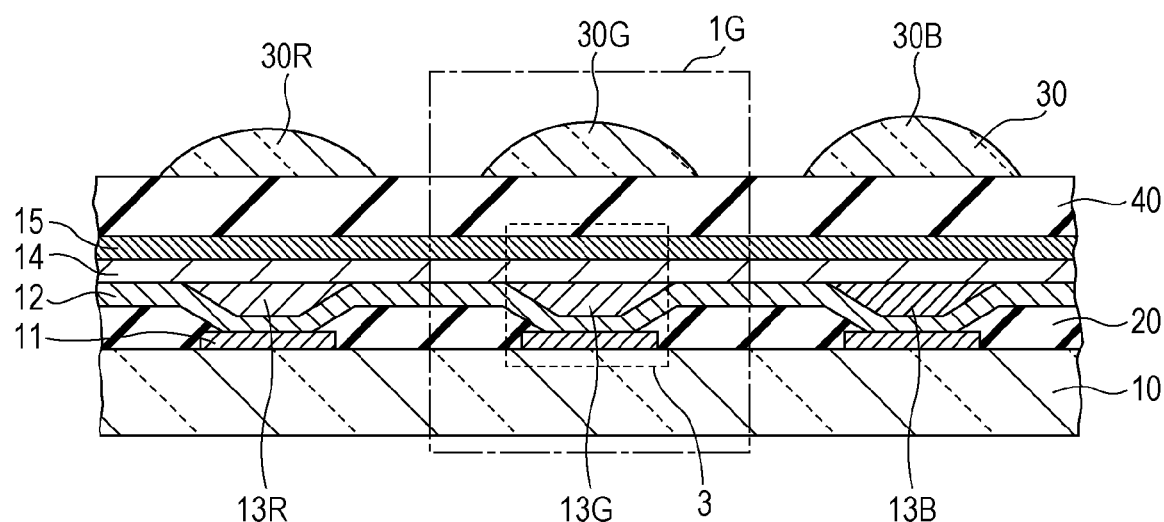

FIG. 1B is a partial schematic sectional view taken along a line IB-IB in FIG. 1A. One pixel includes, on a substrate 10, an organic EL element 3 including a first electrode (anode) 11, a hole transport layer 12, a luminescent layer 13R, 13G or 13B, an electron transport layer 14, and a second electrode (cathode) 15. In the organic EL element 3 according to the embodiment of the present invention, the first electrode 11 has a reflective surface for reflecting light, which is radiated from the luminescent layer and advancing toward the first electrode 11, such that the reflected light is output through the second electrode 15. The luminescent layer 13R is a luminescent layer emitting red light, the luminescent layer 13G is a luminescent layer emitting green light, and the luminescent layer 13B is a luminescent layer emitting blue light. The luminescent layers 13R, 13G and 13B are formed by patterning in corresponding relation to the pixels (i.e., the organic EL elements 3) emitting red, green and blue lights, respectively. Also, the first electrode 11 in one pixel (i.e., one organic EL element 3) is isolated from the first electrode 11 in the adjacent pixel (i.e., the adjacent organic EL element 3). The hole transport layer 12, the electron transport layer 14, and the second electrode 15 may be formed in common to adjacent pixels, or may be formed per pixel by patterning. To avoid short-circuiting between the first electrode 11 and the second electrode 15 through a foreign substance, an insulating layer 20 is disposed between the pixels (more specifically, between the organic EL elements 3).

The display apparatus according to the embodiment of the present invention further includes a lens portion 30. Between the lens portion 30 and the organic EL element 3, a protective layer 40 is disposed to protect the organic EL element 3 against moisture and oxygen. In the lens portion 30, a lens 30R, 30G or 30B having a convex surface is disposed at a position corresponding to each pixel.

Further, in the display apparatus according to the embodiment of the present invention, the diameter of each of the lenses 30R, 30G and 30B is set such that, of light emitted from the organic EL element 3, light emitted at particular angles is not output to the outside. Therefore, the display apparatus can exhibit a good luminance characteristic.

(Action of Lens to Increase Light Taking-Out Efficiency)

Figure 2:
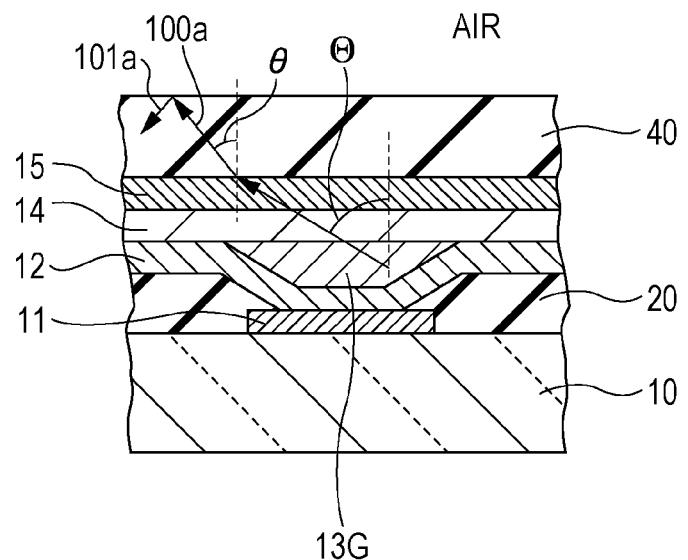
FIG. 2 is a schematic perspective view of a pixel not including a lens.
Figure 3:
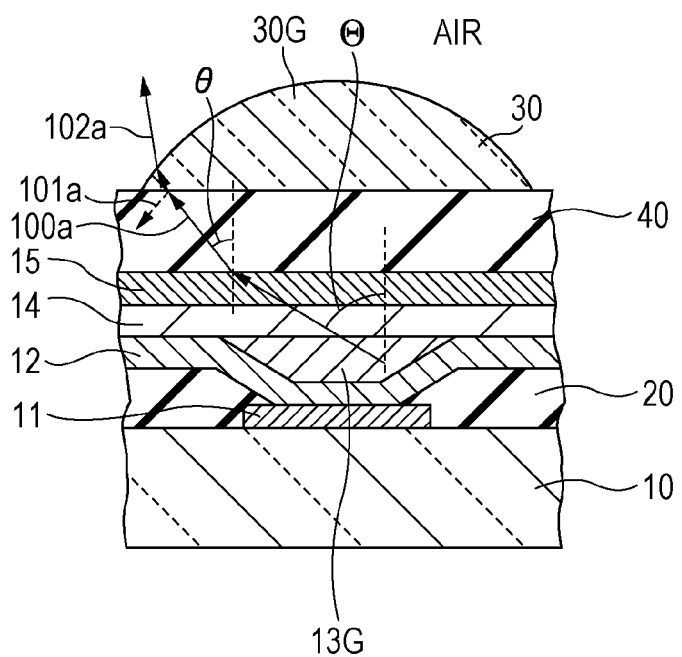
FIG. 3 is a schematic perspective view of a pixel including a lens.

The action of the lens to increase the light taking-out efficiency will be described below with reference to FIGS. 2 and 3. FIGS. 2 and 3 are each an enlarged schematic view illustrating the pixel 1G emitting green light, which corresponds to a region demarcated by a dotted line in FIG. 1B. FIG. 2 illustrates a pixel structure not including the lens portion 30, and FIG. 3 illustrates a pixel structure including the lens portion 30. The same components as those in FIGS. 1A and 1B are denoted by the same reference symbols. Light emitted from the luminescent layer 13G of the organic EL element 3 is refracted when the light enters the protective layer 40. Given that an emission angle of the light emitted from the luminescent layer 13G in the organic EL element 3 is $\Theta$ and a radiation angle of the light in the protective layer 40 after being radiated from the organic EL element 3 into the protective layer 40 is $\theta$, the relationship between $\Theta$ and $\theta$ is expressed by the following formula 2. It is to be noted that $\Theta$ and $\theta$ are each measured on the basis of a direction perpendicular to the substrate 10.

$$n \sin \Theta = n_1 \sin \theta \qquad 2$$

where n is a refractive index of the material (i.e., the luminescent layer 13G in the organic EL element 3) on the incident side, and $n_1$ is a refractive index of the material (i.e., the protective layer 40) on the emergent side.

First, consider the case where the lens 30G is not disposed in the pixel 1G as illustrated in FIG. 2. In this case, the refractive index of the protective layer 40 is higher than that of air. Accordingly, of the light radiated from the organic EL element 3 into the protective layer 40, light 100a radiated at a certain angle (critical angle $\theta_0$) or more is totally reflected at an interface between the protective layer 40 and air. The critical angle $\theta_0$ at which the total reflection occurs is expressed by the following formula 3 by using the refractive index $n_1$ of the material (i.e., the protective layer 40) on the incident side and a refractive index $n_2$ of the material (air) on the emergent side.

$$\theta_0 = \sin^{-1}(n_2/n_1) \qquad 3$$

For example, when the protective layer 40 is made of silicon nitride, the refractive index $n_1$ is the refractive index of the protective layer 40 and 1.96 and the refractive index $n_2$ is the refractive index of air and 1.00. Therefore, the critical angle $\theta_0$ is about 31 degrees. Thus, the light radiated from the organic EL element 3 into the protective layer 40 at an angle of about 31 degrees or more is not taken out to the outside.

Next, consider the case where the lens 30G is disposed in the pixel 1G as illustrated in FIG. 3. For example, when the lens portion 30 is made of an epoxy resin, the refractive index $n_2$ is the refractive index of the lens portion 30 and 1.68. Therefore, the critical angle $\theta_0$ expressed by the formula 3 is about 59 degrees in a region where the lens portion 30 is formed on the protective layer 40.

stated another way, with the provision of the lens 30G, light 101a radiated from the organic EL element 3 into the protective layer 40 at the radiation angle in the range of about 31 degrees to about 59 degrees is taken out as light 102a to the outside, the light 101a being not taken out to the outside when the lens 30G is not provided. As a result, the light taking-out efficiency is increased with the provision of the lens 30G.

(Optical Interference Effect of Organic EL Element)

The optical interference effect of the organic EL element 3 will be described below. In general, a film thickness of each of layers constituting the organic EL element 3, e.g., an organic compound layer, is about several tens nanometers, and an optical distance (nd product) obtained by multiplying a film thickness (d) of each layer and a refractive index (n) of the relevant layer corresponds to about several tenths of a wavelength ($\lambda$=350 nm or longer and 780 nm or shorter) of visible light. Therefore, interference of the visible light noticeably appears inside the organic EL element 3. The relationship among a wavelength $\lambda$ that is intensified by the interference, an optical distance L between the reflective surface provided by the first electrode 11 and the luminescent layer 13G, a phase shift $\phi$ caused when the light is reflected at the reflective surface provided by the first electrode 11, and an integer m which is 0 or more, is expressed by the following formula 4:

$$L = ((m + (\phi/2\pi)) \times (\lambda/2) \qquad 4$$

The phase shift $\phi$ caused at the reflective surface can be expressed by the following formula 5, given that, regarding two materials constituting the reflective surface, the material on the incident side and the material on the emergent side have optical constants $(n_1, k_1)$ and $(n_2, k_2)$, respectively. Those optical constants can be measured by using, e.g., a spectroscopic ellipsometer.

$$\phi=\tan^{-1}(2n_1k_2/(n_1^2-n_2^2-k_2^2)) \qquad 5$$

In the organic EL element 3 according to the embodiment of the present invention, the optical distance L, the phase shift $\phi$, and the integer m are set such that the wavelength $\lambda$ intensified by the interference becomes near a wavelength $\lambda_0$ at which a spectrum of the light emitted from the organic EL element has a maximum peak just at the front side. Thus, the wavelength $\lambda$ intensified by the optical interference effect is substantially equal to the maximum peak wavelength $\lambda_0$ in the spectrum of the light emitted from the organic EL element utilizing the optical interference effect, and a difference between those wavelengths is 10 nm or less. In the following description of the embodiment of the present invention, the wavelength $\lambda$ intensified by the optical interference effect is supposed to be the maximum peak wavelength $\lambda_0$ in the spectrum of the light emitted from the organic EL element. Further, as the optical interference effect between the first electrode 11 and the second electrode 15 of the organic EL element 3 is more effective, this implies that both the wavelengths are closer to each other. In the case of m=0 in the above formula 4, the optical distance L is reduced to such an extent as causing a risk that the first electrode 11 and the second electrode 15 may be short-circuited due to the influence of a foreign substance, for example, and the organic EL element may fail to emit light. For that reason, the organic EL element 3 according to the embodiment of the present invention is constructed on condition of m≥1.

In some cases, the above formula 4 is not satisfied due to influences of an error caused in a process of forming the organic compound layer and a variation of light emission distribution in the luminescent layer. However, it can be regarded that the wavelength $\lambda$ is intensified when the optical distance L is within the range deviated by $\pm\lambda/8$ from a value satisfying the formula 4.

Thus, in the organic EL element 3 according to the embodiment of the present invention, the optical distance L between the reflective surface provided by the first electrode 11 and the luminescent layer satisfies the following formula 6 with respect to the maximum peak wavelength $\lambda_0$ in the spectrum of the light radiated from the organic EL element 3, the phase shift $\phi$ caused when the light is reflected at the reflective surface, and the positive integer m:

$$(\lambda_0/8)\times(4m+2\phi/\pi-1)<L<(\lambda_0/8)\times(4m+2\phi/\pi+1) \qquad 6$$

More beneficially, the optical distance L is within the range deviated by $\pm\lambda/16$ from a value satisfying the formula 4. In other words, the organic EL element 3 according to the embodiment of the present invention more beneficially satisfies the following formula 7.

$$(\lambda_0/16)\times(8m+4\phi/\pi-1)\leq L\leq(\lambda_0/16)\times(8m+4\phi/\pi+1) \qquad 7$$

The formulae 4, 6 and 7 take into consideration, as a most dominant factor, interference between light directly advancing from the luminescent layer 13G toward the second electrode 15 and light reflected once at the first electrode 11. In the organic EL element having a multilayered film, multi-interference occurs. An influence of the multi-interference is also included in the practical optical interference effect.

Figure 4A:
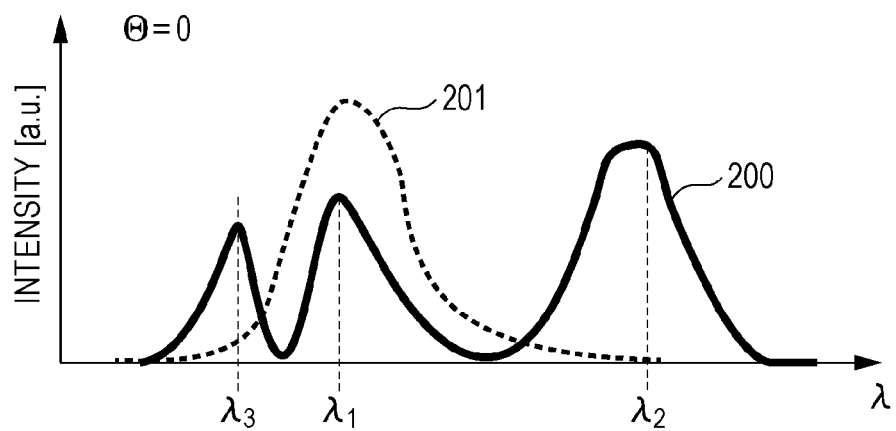
FIGS. 4A to 4D are each a graph illustrating an overlap between an interference intensity spectrum and a PL (photoluminescence) spectrum.

FIGS. 4A to 4D are each a graph illustrating an interference intensity spectrum 200 that represents an intensity distribution with respect to wavelength. In the graph, numeral 201 represent a PL (photoluminescence) spectrum emitted from a luminescent material of the luminescent layer in the organic EL element 3. A color indicated by the organic EL element 3 is determined depending on an overlap between the interference intensity spectrum 200 and the PL spectrum 201. FIG. 4A illustrates the relationship between the interference intensity spectrum 200 and the PL spectrum 201 in the case of $\Theta=0$ in FIG. 3. As described above, $\Theta$ is the emission angle of the light emitted from the luminescent layer 13G in the organic EL element 3.

In FIG. 4A, the interference intensity spectrum 200 has a plurality of local maximum values with respect to wavelength. A wavelength $\lambda_1$ exhibiting a central local maximum value represents a wavelength that is maximally intensified by the interference when the positive integer m in the formula 6 is a certain positive integer M (m=M). Namely, the wavelength $\lambda_1$ is the above-mentioned $\lambda_0$. A wavelength $\lambda_2$ exhibiting a local maximum value on the longer wavelength side than wavelength $\lambda_1$ represents a wavelength that is maximally intensified by the interference when the positive integer m is an integer smaller than M by one, i.e., in the case of m=M−1. A wavelength $\lambda_3$ exhibiting a local maximum value on the shorter wavelength side than wavelength $\lambda_1$ represents a wavelength that is maximally intensified by the interference when the positive integer m is an integer larger than M by one, i.e., in the case of m=M+1. In the organic EL element 3 according to the embodiment of the present invention, the optical distance L is adjusted such that, at $\Theta=0$, the PL spectrum 201 emitted from the luminescent material of the luminescent layer 13G overlaps with a peak including the central local maximum value in the interference intensity spectrum 200 to a large extent.

Figure 4B:
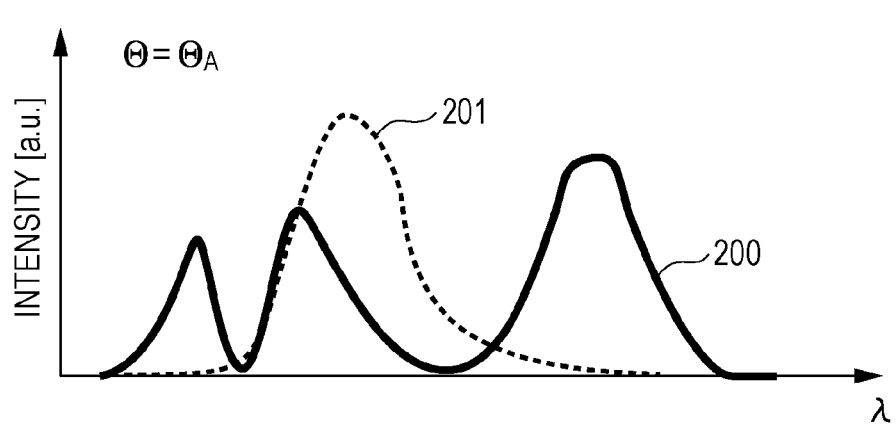

As seen from the above formula 1, as the emission angle $\Theta$ of the light emitted from the organic EL element 3 increases, the wavelength $\lambda$ intensified by the interference becomes shorter. As illustrated in FIG. 4B, therefore, when the emission angle is $\Theta_A$, the local maximum values of the interference intensity spectrum 200 and peaks including those local maximum values are shifted to the shorter wavelength side. As a result, the overlap between the interference intensity spectrum 200 and the PL spectrum 201 is reduced.

Figure 4C:
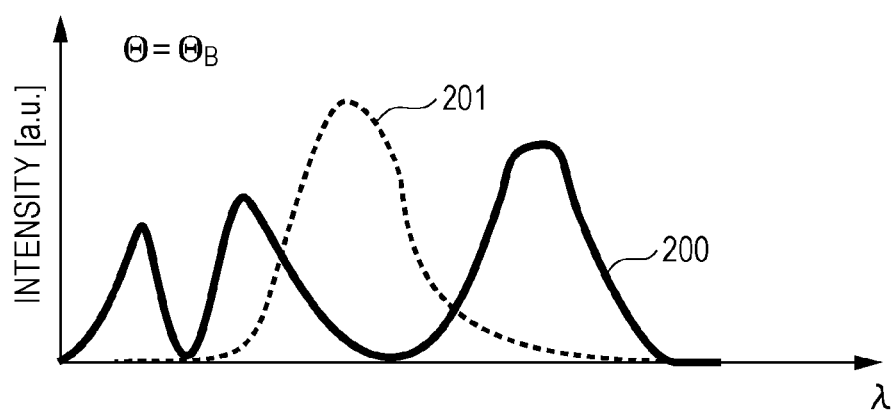

FIG. 4C represents the case where the emission angle is further increased and the overlap between the interference intensity spectrum 200 and the PL spectrum 201 is most reduced. In that case, the emission angle is $\Theta_B$ and the radiation intensity has a local minimum value as described later.

Figure 4D:
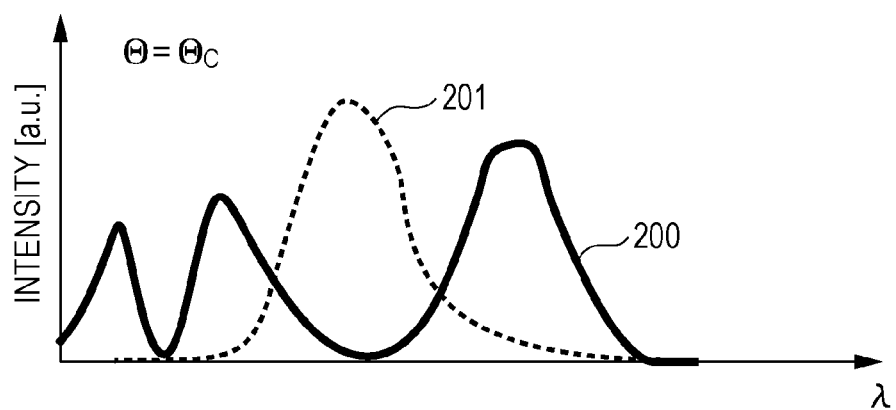

When the emission angle becomes larger than $\Theta_B$, the overlap between the peak in the spectrum corresponding to the positive integer M−1, which is set in the above formula 6 to be smaller than the positive integer M by one, and the PL spectrum 201 is increased to an extent not ignorable. In other words, an overlapped area between the peak in the spectrum corresponding to the positive integer M−1 set in the formula 6 and the PL spectrum 201 is increased to an extent not ignorable in comparison with an overlapped area between the peak in the spectrum corresponding to the positive integer M set in the formula 6 and the PL spectrum 201. FIG. 4D represents the case where the overlapped area between the peak in the spectrum corresponding to the positive integer M set in the formula 6 and the PL spectrum 201 is equal to the overlapped area between the peak in the spectrum corresponding to the positive integer M−1 set in the formula 6 and the PL spectrum 201. The emission angle in that case is defined as $\Theta_C$.

Figure 5:
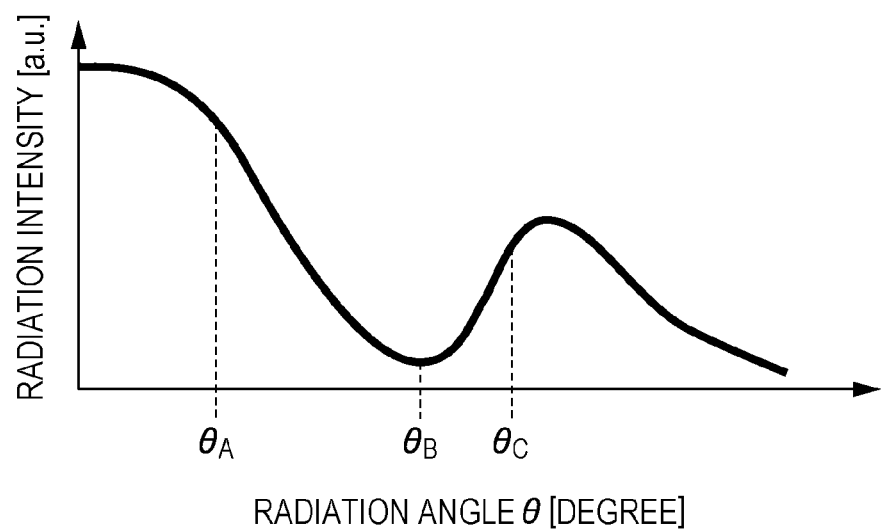
FIG. 5 is a graph plotting a radiation intensity distribution of light radiated from an organic EL element, utilizing the optical interference effect, into a protective layer.

FIG. 5 plots, with respect to the radiation angle $\theta$, a radiation intensity distribution of the light emitted from the organic EL element 3 into the protective layer 40 and satisfying the formula 6, i.e., an intensity distribution obtained from the overlap between the interference intensity spectrum 200 and the PL spectrum 201. In FIG. 5, radiation angles $\theta_A$, $\theta_B$ and $\theta_C$ correspond respectively to the above-mentioned emission angles $\Theta_A$, $\Theta_B$ and $\Theta_C$. Both the angles are related to each other as expressed by the above formula 2.

As seen from FIG. 5, the radiation intensity is gradually reduced starting from the radiation angle of 0 degree, and it takes a local minimum value at the angle $\theta_B$ corresponding to the emission angle $\Theta_B$ at which the overlap between the interference intensity spectrum 200 and the PL spectrum 201 is most reduced. When the radiation angle exceeds $\theta_B$, the radiation intensity is increased again and takes a local maximum value. The radiation intensity distribution takes a local maximum value at a radiation angle larger than $\theta_B$ for the reason that, as described above, the peak in the spectrum corresponding to the integer M−1, which is set in the formula 6 to be smaller than the positive integer M by one, overlaps with the PL spectrum 201 to an extent not ignorable.

It is to be noted that $\theta_B$ (or $\Theta_B$) and $\theta_C$ (or $\Theta_C$) are changed depending on various conditions, such as the material of the protective layer 40, the luminescent material, and the film thicknesses thereof. In other words, $\theta_B$ (or $\Theta_B$) may be larger than or equal to $\theta_C$ (or $\Theta_C$). Further, when the maximum peak wavelength of the interference intensity spectrum 200 at the radiation angle of 0 degree is positioned on the longer wavelength side than that of the PL spectrum 201, the radiation intensity may be temporarily increased starting from the radiation angle of 0 degree and then gradually reduced down to a local minimum value.

(Display Apparatus Provided with Organic EL Element Utilizing Optical Interference Effect and Lens)

As discussed above, the structure including the lens enables, of the light radiated into the protective layer 40, the light radiated at a larger radiation angle to be taken out to the outside in comparison with the structure not including the lens. Accordingly, when the organic EL element satisfying the above formula 6 is used as the organic EL element, even the light radiated at a larger radiation angle than $\theta_B$ denoted in FIG. 5 can also be taken out to the outside. Stated another way, the light that is radiated at a larger radiation angle than $\theta_B$ and that is hardly taken out to the outside with the structure not including the lens can also be taken out to the outside with the structure including the lens. This provides such an unnatural luminance characteristic that, when looking at the display apparatus at an angle increasing with respect to the front side thereof, the luminance is gradually reduced and then increased again.

Furthermore, when the radiation angle exceeds $\theta_C$, the overlapped area between the peak in the spectrum corresponding to the positive integer M−1 set in the formula 6 and the PL spectrum 201 becomes larger than the overlapped area between the peak in the spectrum corresponding to the positive integer M set in the formula 6 and the PL spectrum 201, whereby a deviation of chromaticity is increased.

Accordingly, when the light radiated at a larger angle than the radiation angle $\theta_B$ is taken out to the outside, an unnatural luminance characteristic is generated, and when the light radiated at a larger angle than the radiation angle $\theta_C$ is taken out to the outside, a deviation of chromaticity is increased.

In other words, a display apparatus having a good luminance characteristic can be obtained by not taking out the light that is radiated at a larger angle than the radiation angle $\theta_B$. A display apparatus having a smaller color drift can be obtained by not taking out the light that is radiated at a larger angle than the radiation angle $\theta_C$. Still further, a display apparatus having a good luminance characteristic and a smaller color drift can be obtained by not taking out the light that is radiated at an angle larger than smaller one of $\theta_B$ and $\theta_C$.

(Lens Diameter)

Figure 6:
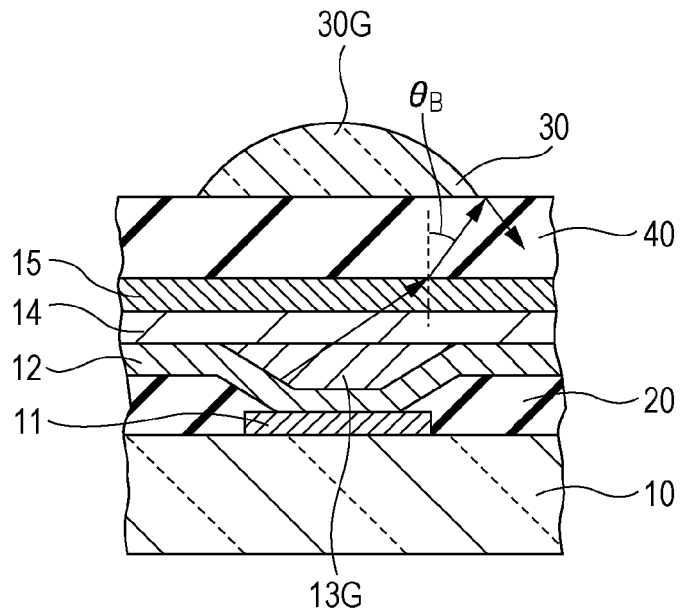
FIG. 6 is a schematic sectional view of the display apparatus according to the embodiment of the present invention.

In the embodiment of the present invention, a lens diameter is specified, as illustrated in FIG. 6, in order to obtain a display apparatus having a good luminance characteristic. More specifically, the lens diameter is set in the embodiment of the present invention such that the light radiated at a larger radiation angle than $\theta_B$ is not output to the outside of the display apparatus. Thus, the diameter of the lens 30G is set such that the light radiated at a larger radiation angle than $\theta_B$ does not enter the lens portion 30. Stated another way, the lens diameter is set such that only the light radiated at a radiation angle not larger than $\theta_B$ is output to the outside through the lens portion 30.

Figure 7:
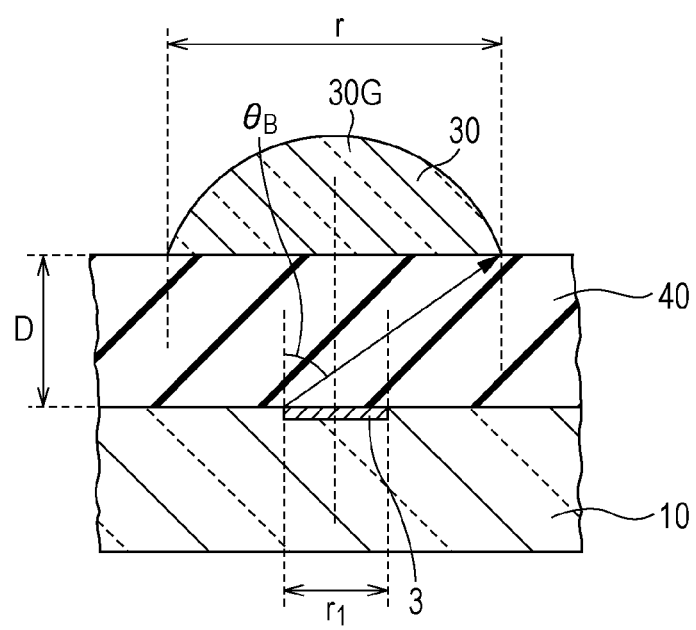
FIG. 7 is an illustration to explain the diameter of a lens in the display apparatus according to the embodiment of the present invention.

The lens diameter in the embodiment of the present invention will be described in more detail below with reference to FIG. 7. FIG. 7 is a schematic sectional view of the display apparatus according to the embodiment of the present invention. In FIG. 7, detailed illustration of the individual components of the organic EL element 3 is omitted on condition that the thickness of the organic EL element 3 is sufficiently smaller than that of the protective layer 40. Parameters denoted in FIG. 7 are as follows.

r: diameter of the lens 30G
$r_1$: width of the luminescent region of the organic EL element 3
D: film thickness of the protective layer 40

Further, a center axis of the lens 30G and a center axis of the luminescent region are aligned with each other. On the basis of those parameters, the diameter of the lens 30G in the embodiment of the present invention is set so as to satisfy the following formula 8. When the formula 8 is satisfied, light emitted from any position within the luminescent region at an angle larger than the emission angle $\Theta_B$, i.e., the radiation angle $\theta_B$, is not output to the outside through the lens 30G.

$$r \leq 2D \tan(\theta_B) - r_1 \qquad 8$$

When a display apparatus having a smaller color drift is to be obtained, $\theta_B$ is replaced with $\theta_C$. In the embodiment of the present invention, the lens diameter r is optimum when the relationship indicated by an equal mark in the formula 8 is satisfied. Further, considering the effect in increasing the light taking-out efficiency, it is beneficial that the lens diameter r is not smaller than the width of the luminescent region of the organic EL element 3. Thus, $r \geq r_1$ is to be satisfied.

When the protective layer 40 has, instead of a single-layer structure, a stacked structure of two layers that are made of materials having different refractive indexes, the diameter r of the lens 30G in the embodiment of the present invention is set so as to satisfy the following formula 9;

$$r \leq 2D_1 \tan(\theta'_B) + 2D_2 \tan(\theta^*_B) - r_1 \qquad 9$$

where $D_1$ is a film thickness of a protective layer (first protective layer) on the side closer to the organic EL element 3, and $D_2$ is a film thickness of a protective layer (second protective layer) on the side closer to the lens portion 30. Further, $\theta'_B$ is a radiation angle in the first protective layer, which corresponds to the emission angle $\Theta_B$, and $\theta^*_B$ is a radiation angle in the second protective layer, which corresponds to the emission angle $\Theta_B$.

When the display apparatus includes the organic EL elements 3 of two or more different colors as illustrated in FIGS. 1A and 1B, the PL spectrum of the luminescent layer in the organic EL element 3 has a contour different per color and $\theta_B$ (or $\Theta_B$) also differs per color. Therefore, the lens diameter may be changed for each of the pixels emitting lights of different colors. As an alternative, lenses having a common lens diameter may be disposed for all the organic EL elements while the common lens diameter is set to be adapted for the pixel of a color that provides the minimum $\theta_B$ (or $\Theta_B$). Stated another way, in a display apparatus in which a pixel unit includes a red light-emitting pixel, a green light-emitting pixel, and a blue light-emitting pixel, when $\theta_B$ of the blue light-emitting pixel is smaller than those of the pixels emitting lights of the other colors, lenses for the pixels of the other colors may be set to have the same lens diameter as that for the blue light-emitting pixel, which diameter is defined by substituting the relevant $\theta_B$ in the formula 8.

(Components of Display Apparatus)

The substrate 10 is an insulating substrate in which switching elements (not illustrated), such as TFTs or MIMs, are formed. The substrate 10 is made of, e.g., glass or plastic. Further, the substrate 10 may include an interlayer insulating film in which contact holes are formed for electrical connection between the switching elements and the first electrodes 11. In addition, the substrate 10 may include a planarizing film that serves to planarize unevenness caused by the presence of the switching elements.

The first electrode 11 can be formed as a metal layer of an elemental metal, e.g., Al, Cr or Ag, or an alloy thereof. As an alternative, the first electrode 11 may be formed by stacking, on a metal layer, a transparent conductive oxide layer, e.g., a compound layer of indium oxide and tin oxide or a compound layer of indium oxide and zinc oxide. The film thickness of the first electrode 11 is to be 50 nm or more and 200 nm or less. Here, the term "transparent" implies that optical transmittance is 40% or more in the visible light range (wavelengths of 400 nm to 780 nm).

When the first electrode 11 is formed of only a metal layer, the reflective surface provided by the first electrode 11 is an interface between the metal layer and the organic compound layer. When the first electrode 11 has a stacked structure of a metal layer and a transparent conductive oxide layer, the reflective surface provided by the first electrode 11 is an interface between the metal layer and the transparent conductive oxide layer.

The hole transport layer 12 is formed of a single layer or plural layers each of which is made of an organic compound having a hole injection property and a hole transport property. On the other hand, the electron transport layer 14 is formed of a single layer or plural layers each of which is made of an organic compound having an electron injection property and an electron transport property. Depending on cases, an electron blocking layer may be disposed as the hole transport layer 12 to inhibit electrons from moving to the anode side from the luminescent layer. Also, a hole blocking layer may be disposed as the electron transport layer 14. Further, an exciton blocking layer may be disposed as the hole transport layer 12 or the electron transport layer 14 to inhibit diffusion of excitons generated in the luminescent layer.

Materials of the luminescent layer 13R emitting red light, the luminescent layer 13G emitting green light, and the luminescent layer 13B emitting blue light are not limited to particular ones, and they can be selected from general materials. Those luminescent layers can be each formed of, e.g., a simple layer made of a material having a luminescent property and a carrier transport property, or a mixed layer of a luminescent material, such as a fluorescent material or a phosphorescent material, and a host material having a carrier transport property.

The luminescent layers 13R, 13G and 13B, the hole transport layer 12, and the electron transport layer 14 can be made of general materials and can be formed by using general film forming techniques, e.g., vapor deposition and transfer. The film thickness of each of those layers is to be set optimum in order to increase the luminous efficiency of the organic EL element for the corresponding color. From that point of view, the film thickness is to be 5 nm or more and 100 nm or less.

The second electrode 15 can be formed as a metal thin film of an elemental metal, e.g., Al, Cr or Ag, or an alloy thereof. In particular, since a metal thin film containing Ag has a low absorption rate and a low specific resistance, it is a beneficial material of the second electrode 15. The film thickness of the second electrode 15 is to be 5 nm or more and 30 nm or less. As an alternative, the second electrode 15 may be formed by stacking the above-mentioned metal thin film and a transparent conductive oxide layer, e.g., a compound layer of indium oxide and tin oxide or a compound layer of indium oxide and zinc oxide, or it may be formed of only a transparent conductive oxide layer.

The protective layer 40 can be formed by using general materials and general film forming techniques. For example, a method of forming a film of silicon nitride (SiN) or silicon oxynitride (SiON) by a CVD apparatus can be used. The film thickness of the protective layer 40 is to be in the range of 0.5 µm to 10 µm from the viewpoint of ensuring sufficient protection performance.

The lens portion 30 can be made of a thermosetting resin, a thermoplastic resin, or a photo-curable resin each having a small moisture content. The film thickness of the lens portion 30 is to be in the range of 10 µm to 100 µm. When using the thermosetting resin or the photo-curable resin, the lens portion 30 can be formed by a general film forming method, e.g., spin coating or dispensing. As an alternative, the lens portion 30 may be formed by a method of attaching a film of the thermoplastic resin with a film thickness of about 10 µm to 100 µm onto the protective layer 40 under vacuum. Practically beneficial examples of resin materials are an epoxy resin and a butyl resin.

The lenses 30R, 30G and 30B can be formed, for example, by using the following fabrication methods:

(1) A method of preparing a lens die and pressing the die against a resin layer, thereby forming the resin layer into a lens shape.
(2) A method of heat-treating a resin layer, which has been formed by patterning with, e.g., photolithography, and deforming the resin layer into a lens shape through reflow.
(3) A method of making a photo-curable resin layer, which has been formed in a uniform thickness, exposed to light having a distribution in the in-plane direction, and developing the resin layer, thereby forming a lens.
(4) A method of processing the surface of a resin material, which has been formed in a uniform thickness, into a lens shape by using an ion beam, an electron beam, or a laser.
(5) A method of forming a lens in a self-alignment manner by dropping a proper amount of resin for each pixel.
(6) A method of, separately from a substrate on which organic EL elements are formed in advance, a resin sheet on which lenses are formed in advance, and bonding the substrate and the resin sheet with each other after aligning them, thereby forming the lenses above the organic EL elements.

Other methods can also be used to form lenses.

An inorganic material, e.g., SiN or SiO, may be used for the lens portion 30. In such a case, a SiN layer or a SiO layer is first formed by the CVD process. Then, a structure having a lens shape is formed on the SiN layer or the SiO layer. Through dry etching, the lens shape is transferred to the SiN layer or the SiO layer.

The lenses 30R, 30G and 30B may have a convex or concave shape as long as each lens can exhibit a condensing characteristic. The term "condensing characteristic" implies a characteristic that increases light intensity in the front direction in comparison with a light radiation characteristic obtained with a flat taking-out surface without including a lens. The condensing characteristic of the lens depends on an area of a luminescent surface of the organic EL element, a lens curvature, a distance from the luminescent surface to the lens, a refractive index of the lens material, etc. The lens is to be designed on the basis of those parameters such that a satisfactory condensing characteristic is obtained.

The display apparatus according to the embodiment of the present invention can be applied to mobile devices in which an improvement of visibility with a high luminance is important, such as a backside monitor of a digital camera and a display for a cellular phone. Further, since lower power consumption is expected on the basis of the same luminance, applications to indoor uses are also beneficial.

It is to be noted that the present invention is not limited to the above-described constructions and can be variously applied and modified without departing from the gist of the invention.

EXAMPLE

A method of manufacturing the display apparatus according to the embodiment of the present invention is described in this EXAMPLE with reference to FIGS. 8A to 8D.

Figure 8A:
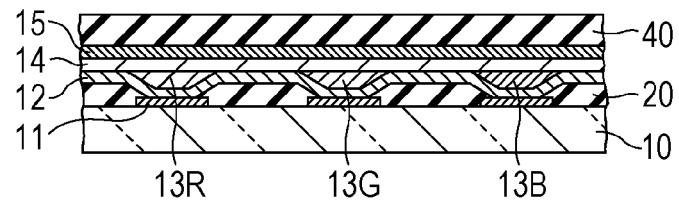
FIGS. 8A to 8D are schematic sectional views to explain successive steps of a method of manufacturing the display apparatus according to the embodiment of the present invention.

A substrate 10, illustrated in FIG. 8A, was prepared by forming, on a glass substrate, a pixel circuit (not illustrated) by using a low-temperature polysilicon TFT liquid crystal, and forming an interlayer insulating film made of SiN and a planarizing film made of an acryl resin on the pixel circuit in that order. On the substrate 10 thus obtained, an ITO film and an AlNd film were formed by sputtering in thicknesses of 40 nm and 100 nm, respectively. The ITO film and the AlNd film were then subjected to patterning per pixel, whereby the first electrodes 11 were formed. The reflective surface provided by the first electrode 11 was an interface between the ITO film and the AlNd film. Phase shifts caused upon light being reflected at the interface were 2.42 [rad], 2.15 [rad], and 1.81 [rad] at wavelengths of 620 nm, 520 nm, and 460 nm, respectively.

An acryl resin was spin-coated thereon. The coated acryl resin had a thickness of 1.0 µm. The acryl resin was then subjected to patterning by lithography to form an opening (which corresponds to a pixel) at a position where the first electrode 11 was formed. The insulating layer 20 was thereby formed. The pitch between the pixels was 20 µm, and the size of an exposed portion of the first electrode 11, which portion is exposed through the opening, i.e., the width of the luminescent region, was 5.0 µm. The substrate was then subjected to ultrasonic cleaning with isopropyl alcohol (IPA), to boiling cleaning, and further to drying. After UV/ozone cleaning, organic compound layers were formed by the vacuum vapor deposition process.

As the organic compound layers, a first hole transport layer 12 was first formed in a film thickness of 100 nm in common to all the pixels. A second hole transport layer (not illustrated) was then formed in film thicknesses of 95 nm and 45 nm in the red and green light-emitting pixels, respectively, by using shadow masks. A red light-emitting layer 13R, a green light-emitting layer 13G, and a blue light-emitting layer 13B were then formed in film thicknesses of 30 nm, 40 nm and 25 nm, respectively, by using shadow masks. Further, an electron transport layer 14 was formed in a film thickness of 50 nm in common to all the pixels.

Next, the substrate 10 including the organic compound layers formed thereon was transferred, without breaking the vacuum, to a sputtering apparatus in which an Ag film and a transparent electrode layer were successively formed as the second electrode 15 in film thicknesses of 10 nm and 50 nm, respectively. A mixture of indium oxide and zinc oxide was used as a material of the transparent electrode layer.

Optical distances $L_R$, $L_G$ and $L_B$ from the red light-emitting layer 13R in the pixel emitting red light, the green light-emitting layer 13G in the pixel emitting green light, and the blue light-emitting layer 13B in the pixel emitting blue light to the reflective surfaces in the corresponding first electrodes 11 were as given below. Maximum peak wavelengths $\lambda_0$ generated from the organic EL elements in the pixels emitting red, green and blue lights were 620 nm, 520 nm and 460 nm, respectively. The refractive indexes of the ITO film at the wavelengths of 620 nm, 520 nm, and 460 nm were 2.01, 2.07 and 2.12, respectively. Further, the refractive indexes of the hole transport layer at the wavelengths of 620 nm, 520 nm, and 460 nm were 1.74, 1.80 and 1.88, respectively.

$L_R = 40 \times 2.01 + (100+95) \times 1.74 = 419.70$ nm $L_G = 40 \times 2.07 + (100+45) \times 1.80 = 343.80$ nm $L_B = 40 \times 2.12 + 100 \times 1.88 = 272.80$ nm Thus, in each of the organic EL elements in the pixels emitting red, green and blue lights, the above formula 6 was satisfied at m=1 as follows:

351.90 nm < $L_R$ = 419.70 nm < 506.90 nm 283.97 nm < $L_G$ = 343.80 nm < 413.97 nm 238.75 nm < $L_B$ = 272.80 nm < 353.75 nm

Next, as illustrated in FIG. 8A, the protective layer 40 made of silicon nitride was formed in a film thickness of 10 µm by the plasma CVD process using a $SiH_4$ gas, a $N_2$ gas, and a $H_2$ gas. The refractive index of the protective layer 40 was 1.96.

Here, $\theta_B$ providing the local minimum value of the light intensity distribution of the light radiated into the protective layer 40 with respect to the radiation angle was 45 degrees, 40 degrees, and 35 degrees for the pixels emitting red, green and blue lights, respectively. The lens diameter was set in common to all the pixels emitting red, green and blue lights such that light radiated at a larger angle than $\theta_B$=35 degrees, which was obtained for the pixel emitting blue light, was not output to the outside of the display apparatus. In more detail, by substituting the film thickness D of the protective layer=10 µm, $\theta_B$=35 degrees, and the width $r_1$ of the luminescent region=5.0 µm in the above formula 8, the lens diameter r was set so as to satisfy r≤9.0 µm.

Figure 8B:
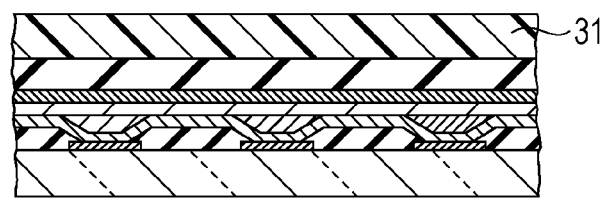

Next, as illustrated in FIG. 8B, a thermosetting resin material (epoxy resin) 31 having viscosity of 3000 mPa·s and refractive index of 1.60 under a nitrogen atmosphere at a dew-point temperature of 60° C. was coated over the protective layer by using a dispenser (made by Musashi Engineering, Inc., Product Name SHOT MINI SL) with a function of precise drawing.

Figure 8C:
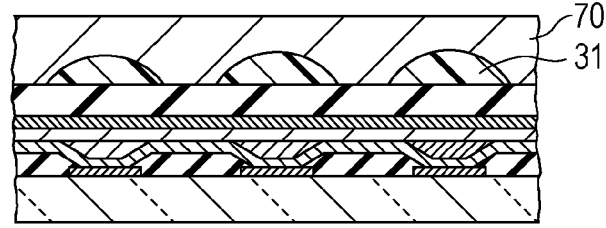

Prior to thermally hardening the resin material 31, a lens shaping die 70 prepared separately was pressed against the surface of the resin material 31, as illustrated in FIG. 8C. When pressing the die 70, positioning was performed by aligning an alignment mark formed on the die 70 with an alignment mark formed on the substrate 10. The die 70 had concave recesses formed at the same pitch as the pixel pitch. A Teflon (registered trademark) based resin was coated as a releasing agent on an inner surface of each recess. The recess shape, i.e., the shape of each of the lenses 30R, 30G and 30B, was set to have a lens diameter of 8.7 μm and a curvature radius of 6.0 μm. Because the pixel pitch was 20 μm, the height of the resin material 31 was about 3.6 μm.

Figure 8D:
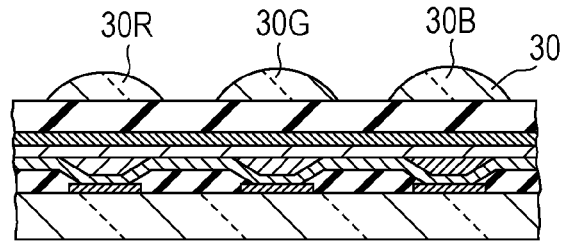

The resin material (epoxy resin) 31 was hardened by heating it under vacuum environment for 15 minutes at a temperature of 100° C. in a state keeping the die 70 in the pressed state. Thereafter, the die 70 was released from the resin, whereby the lens portion 30 including the lenses 30R, 30G and 30B in alignment with the corresponding pixels was obtained, as illustrated in FIG. 8D.

The diameter of each of the lenses 30R, 30G and 30B was 8.7 μm that was smaller than 9.0 μm and larger than the width of 5.0 μm of the luminescent region.

A display apparatus having a good luminance characteristic was obtained by providing the lenses each having the above-mentioned lens diameter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-146514 filed Jun. 30, 2011, which is hereby incorporated by reference herein in its entirety.

What is claimed is:

1. A display apparatus comprising:
   an organic EL element including a first electrode, a luminescent layer, and a second electrode, the organic EL element radiating light through the second electrode;
   a protective layer disposed on the second electrode; and
   a lens disposed on the protective layer,
   wherein an optical distance L between a reflective surface provided by the first electrode and the luminescent layer satisfies a relationship of:

$$(\lambda_0/8) \times (4m+2\phi/\pi-1) < L < (\lambda_0/8) \times (4m+2\phi/\pi+1)$$

with respect to a maximum peak wavelength $\lambda_0$ in a spectrum of the light radiated from the organic EL element, a phase shift $\phi$ caused when the light is reflected at the reflective surface, and a positive integer m,
   a light intensity distribution with respect to a radiation angle of the light radiated from the organic EL element into the protective layer has a local minimum value, and
   a diameter of the lens, a film thickness of the protective layer, and a width of a luminance region are set such that, of the light radiated into the protective layer, light radiated at a larger angle than an angle, at which the light intensity distribution takes the local minimum value, is not output to an outside of the display apparatus.

2. The display apparatus according to claim 1, wherein a diameter r of the lens satisfies a relationship of:

$$r_1 \le r \le 2D \tan(\theta_B) - r_1$$

with respect to an angle $\theta_B$ at which the light intensity distribution takes the local minimum value, a width $r_1$ of a luminescent region of the organic EL element, and a film thickness D of the protective layer.

3. The display apparatus according to claim 1, wherein the organic EL element includes an organic EL element emitting red light, an organic EL element emitting green light, and an organic EL element emitting blue light,
   the lens is disposed at a position corresponding to each of the organic EL element emitting red light, the organic EL element emitting green light, and the organic EL element emitting blue light,
   the lens diameter is in common to the lenses corresponding to the organic EL element emitting red light, the organic EL element emitting green light, and the organic EL element emitting blue light, and
   the common lens diameter is set such that light radiated at a larger angle than minimum one of angles, at which light intensity distributions of lights radiated from the organic EL element emitting red light, the organic EL element emitting green light, and the organic EL element emitting blue light into the protective layers with respect to radiation angles of the lights take the local minimum values, is not output to the outside of the display apparatus.

4. The display apparatus according to claim 1, wherein the optical distance L satisfies a relationship of:

$$(\lambda_0/16) \times (8m+4\phi/\pi-1) \le L \le (\lambda_0/16) \times (8m+4\phi/\pi+1).$$

5. The display apparatus according to claim 1, wherein the diameter of a lens along a first axis is different from the diameter of a lens along a second axis.

6. The display apparatus according to claim 1,
   wherein the protective layer includes a first protective layer on a side closer to the organic EL element and a second protective layer on a side closer to the lens,
   wherein the diameter of the lens satisfies a relationship:

$$r \le 2D_1 \tan(\theta'_B) + 2D_2 \tan(\theta^*_B) - r_1$$

where $D_1$ is a film thickness of the first protective layer, $D_2$ is a film thickness of the second protective layer, $\theta'_B$ is a radiation angle in the first protective layer, which corresponds to an emission angle $\Theta_B$, and $\theta^*_B$ is a radiation angle in the second protective layer, which corresponds to the emission angle $\Theta_B$.

7. A display apparatus comprising:
   a light producing element made of a material in a solid phase for producing light wherein:
      the light producing element has a first width,
      the light producing element is a first depth from a protective layer, and
      the light producing element produces light that passes from the light producing element, only through solid phase material, with a light intensity angular distribution before exiting the protective layer, wherein the light intensity angular distribution includes:
         a first peak in the light intensity angular distribution substantially centered at 0 degrees from a first line perpendicular to the protective layer,
         a minimum in the light intensity angular distribution centered at a first angle, and
         a second peak in the light intensity angular distribution centered at a second angle, wherein the second angle is greater than first angle; and
   an optical element disposed on the protective layer wherein:
      a second width of the optical element is greater than the first width,
      the optical element condenses some of the light produced by the light producing element, and
      the optical element does not condense light produced by the light producing element that is greater than the second angle, due to the second width of the optical element.

8. The display apparatus according to claim 7, wherein the optical element does not condense light produced by the light producing element that is greater than the first angle.

9. The display apparatus according to claim 7 further comprising an array of light producing elements and an array of lenses.

10. The display apparatus according to claim 7, wherein the color drift as a function of radiation angle before exiting the protective layer is greater than the color drift as a function of radiation angle exiting the display apparatus.

11. The display apparatus according to claim 7, wherein the light producing element is an organic electro-luminescent element.

12. The display apparatus according to claim 7, wherein the solid material between the optical element and the light producing element includes a transparent electrode.

* * * * *